United States Patent
Saxena

(10) Patent No.: US 10,641,804 B1
(45) Date of Patent: May 5, 2020

(54) METHOD FOR APPLYING CHARGE-BASED-CAPACITANCE-MEASUREMENT WITH SWITCHES USING ONLY NMOS OR ONLY PMOS TRANSISTORS

(71) Applicant: PDF Solutions, Inc., San Jose, CA (US)

(72) Inventor: Sharad Saxena, Richardson, TX (US)

(73) Assignee: PDF Solutions, Inc., Santa Clara, CA (US)

( * ) Notice: Subject to any disclaimer, the term of this patent is extended or adjusted under 35 U.S.C. 154(b) by 400 days.

(21) Appl. No.: 15/269,843

(22) Filed: Sep. 19, 2016

Related U.S. Application Data

(60) Provisional application No. 62/220,153, filed on Sep. 17, 2015.

(51) Int. Cl.
| | |
|---|---|
| *G01R 27/26* | (2006.01) |
| *G01R 31/01* | (2020.01) |
| *G01B 7/02* | (2006.01) |
| *G01N 27/22* | (2006.01) |

(52) U.S. Cl.
CPC ....... *G01R 27/2605* (2013.01); *G01R 31/016* (2013.01); *G01B 7/02* (2013.01); *G01N 27/228* (2013.01)

(58) Field of Classification Search
CPC .. G01R 27/26; G01R 27/2605; G01R 31/016; G01R 31/028; G01N 27/228; H01L 22/34
See application file for complete search history.

(56) References Cited

U.S. PATENT DOCUMENTS

| | | | | |
|---|---|---|---|---|
| 6,530,064 | B1* | 3/2003 | Vasanth | G06F 17/18 703/14 |
| 6,838,869 | B1* | 1/2005 | Rogers | G01R 27/2605 257/48 |
| 2001/0026989 | A1* | 10/2001 | Thapar | H01L 29/7813 438/400 |

(Continued)

OTHER PUBLICATIONS

Chang, Yao-Wen et al, A Novel Simple CBCM Method Free From Charge Injection-Induced Errors, May 2004, IEEE Electron Device Letters, vol. 25 (Year: 2004).*

*Primary Examiner* — Son T Le
*Assistant Examiner* — Dustin R Dickinson
(74) *Attorney, Agent, or Firm* — Pillsbury Winthrop Shaw Pittman LLP

(57) ABSTRACT

Described is a CBCM technique that works only with PMOS transistors or only with NMOS transistors. Specifically, a method of monitoring performance of an integrated circuit device using a CBCM technique is disclosed, the method comprising: providing a metrology structure having a pseudo-inverter comprising a pull-up pull-down transistor switch, wherein the transistor switch comprises a pull-up transistor and a pull-down transistor of the same type; charging and discharging a device under test (DUT) coupled to the pseudo-inverter using a non-overlapping clock; measuring capacitance of the DUT with a gate voltage of the pull-up transistor at a preset value; and, using the value of the measured capacitance to estimate a dimension of a structure in the integrated circuit device. The non-overlapping clock is generated by: turning the pull-down transistor off when the pull-up transistor is on; and, turning the pull-down transistor on when the pull-up transistor is off.

16 Claims, 4 Drawing Sheets

(56) References Cited

U.S. PATENT DOCUMENTS

2004/0227527 A1* 11/2004 Bortesi .............. G01R 27/2605
  324/676
2009/0160477 A1*  6/2009 Agarwal ............ G01R 31/2884
  324/762.05

* cited by examiner

METHOD FOR APPLYING CHARGE-BASED-CAPACITANCE-MEASUREMENT WITH SWITCHES USING ONLY NMOS OR ONLY PMOS TRANSISTORS

RELATED APPLICATIONS

This application claims the benefit of U.S. Provisional Patent Application Ser. No. 62/220,153 filed Sep. 17, 2015 and is incorporated herein in its entirety.

BACKGROUND OF THE INVENTION

Field of the Invention

This disclosure relates to robust metrology techniques and test structures for measuring capacitance in integrated circuits.

Brief Description of the Prior Art

Charge-based capacitance measurement (CBCM) and its variants like charge-injection-error-free CBCM (CIEF-CBCM) are very effective techniques for fast measurement of capacitance in CMOS technologies. NMOS and PMOS transistors available in the technology can be utilized to make the pseudo-inverter required by the CBCM technique and its variants. However, many technologies exist where both NMOS and PMOS are not available. Example of such a technology is an image-sensor technology where only NMOS is available and a thin-film transistor (TFT) based display technologies where also only NMOS is available. Furthermore, even in twin-well CMOS technologies when the capacitance of interest is a transistor capacitance, techniques like CIEF-CBCM cannot be used when the pseudo-inverter includes both NMOS and PMOS transistors. This is because p-substrate in these technologies is common to all NMOS and when the substrate is changed as needed for CIEF¬CBCM, the pseudo-inverter behavior changes giving erroneous results for the capacitance. What is needed is a test structure and testing method that is suitable for only NMOS or only PMOS based devices rather than CMOS devices.

SUMMARY

Described is a CBCM technique that works only with PMOS transistors or only with NMOS transistors. Specifically, a method of monitoring performance of an integrated circuit device using a CBCM technique is disclosed, the method comprising: providing a metrology structure having a pseudo-inverter comprising a pull-up pull-down transistor switch, wherein the transistor switch comprises a pull-up transistor and a pull-down transistor of the same type; charging and discharging a device under test (DUT) coupled to the pseudo-inverter using a non-overlapping clock; measuring capacitance of the DUT with a gate voltage of the pull-up transistor at a preset value; and, using the value of the measured capacitance to estimate a dimension of a structure in the integrated circuit device, where a dimensional accuracy of the structure is directly related to a desired performance of the integrated circuit. The non-overlapping clock is generated by: turning the pull-down transistor off when the pull-up transistor is on; and, turning the pull-down transistor on when the pull-up transistor is off.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION OF THE INVENTION

Embodiments of the present invention will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

Described here is a pseudo-inverter configuration which works only with PMOS transistors to alleviate the shortcoming of traditional NMOS-PMOS based pseudo-inverter because each PMOS is in its own NWELL. Similarly, a pseudo-inverter which has only NMOS transistors and no PMOS transistors can also be implemented.

Figure 1A:
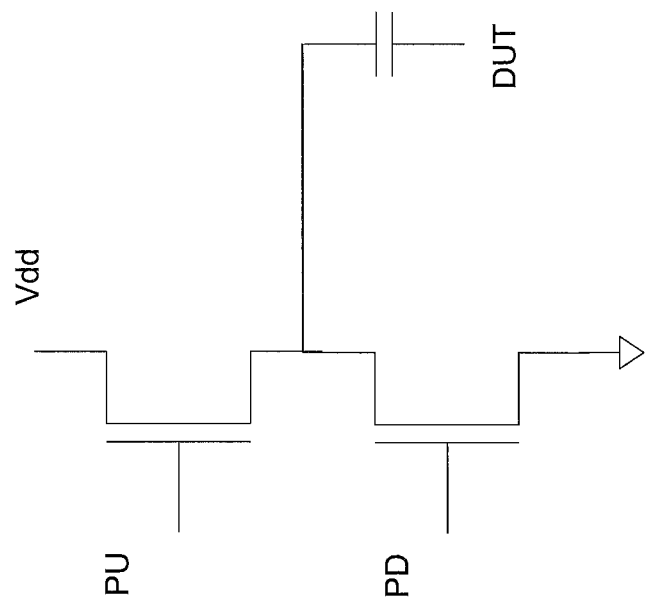
FIG. 1A illustrates a circuit using NMOS-only pseudo-inverter, according to an embodiment of the present invention.
Figure 1B:
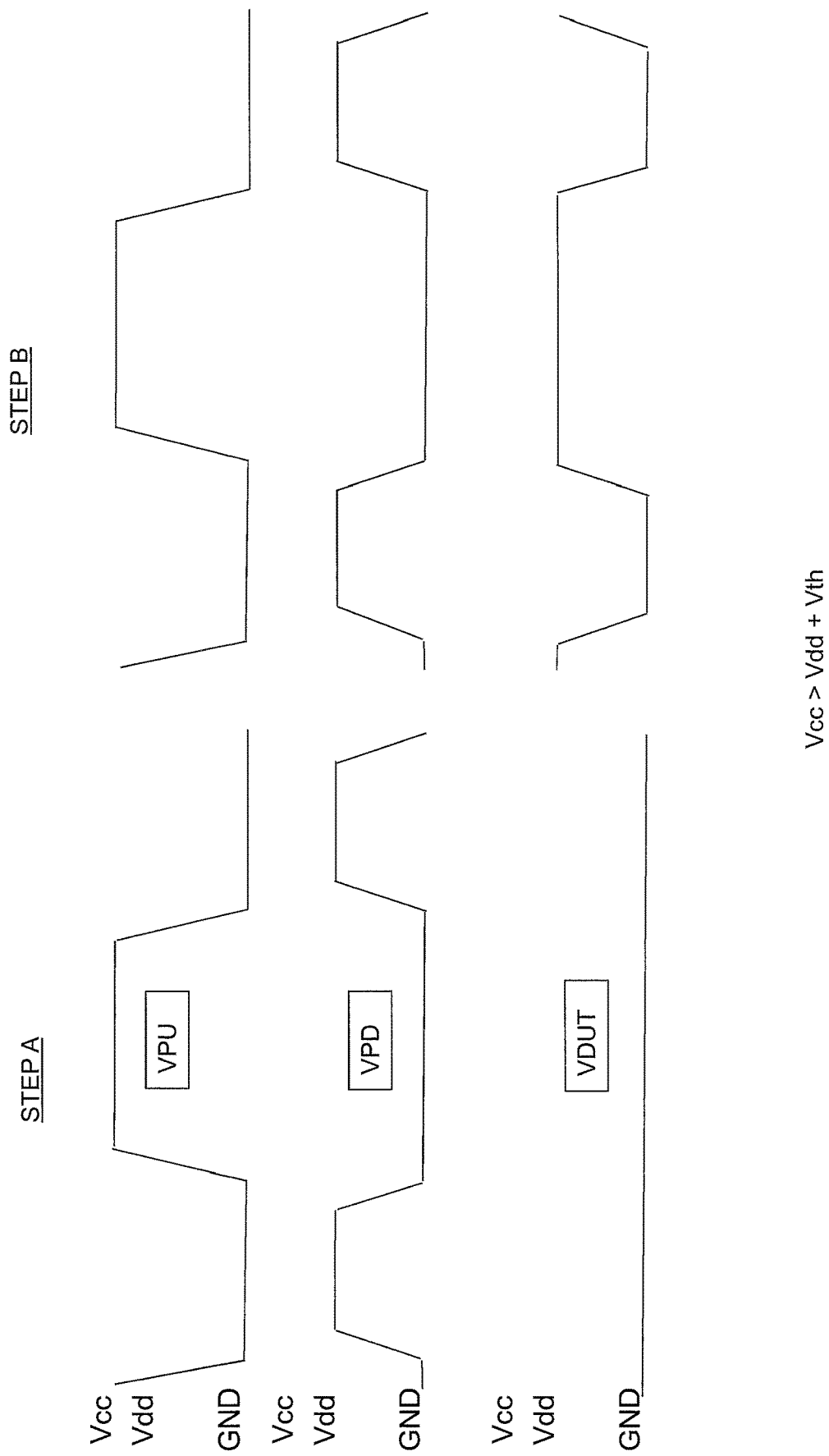
FIG. 1B illustrates the timing diagram suitable for the circuit of FIG. 1A.

FIGS. 1A and 1B respectively show a circuit and a timing diagram suitable for NMOS only pseudo-inverter suitable for CBCM measurements. The circuit is suitable for CBCM variants too, such as CIEF-CBCM. The main idea is that non-overlapping clocks can be generated in such a way that pull-down (PD) NMOS is off when pull-up (PU) NMOS is on and PD NMOS is on when PU is off. Likewise the backside bias required on the device-under-test (DUT) for a CIEF like approach can also be generated to make sure the potential on the back side of the DUT is Vdd when PU is on and it is GND when PD is on. One important modification is to PU gate voltage. As shown is FIG. 1B, the pull up gate voltage should be the maximum desired voltage for measuring DUT capacitance plus at least the worst case threshold voltage of the PU NMOS. Additional margin in PU gate voltage while still keeping the gate voltage below oxide breakdown will make the design even more robust.

Figure 2A:
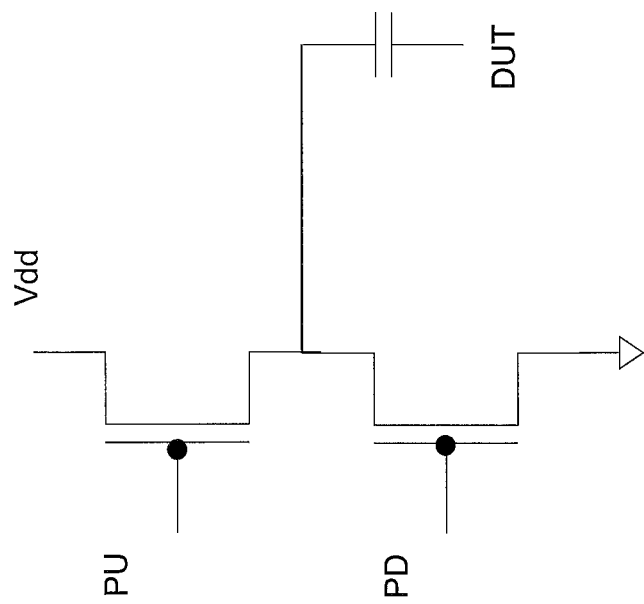
FIG. 2A illustrates a circuit using PMOS-only pseudo-inverter, according to an embodiment of the present invention.
Figure 2B:
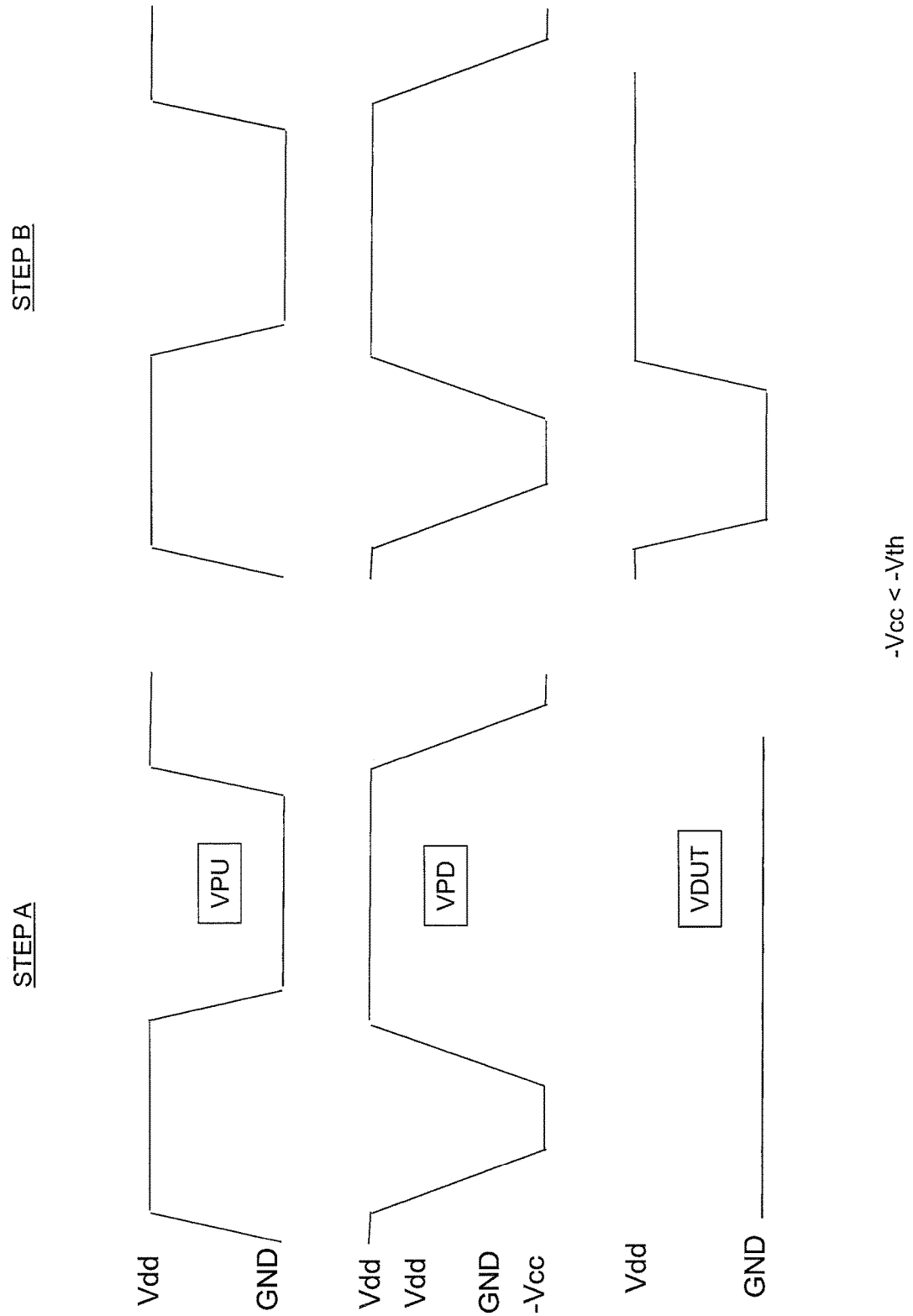
FIG. 2B illustrates the timing diagram suitable for the circuit of FIG. 2A.

FIGS. 2A and 2B respectively show a circuit and a timing diagram suitable for PMOS only pseudo-inverter. Similar to the NMOS only case, the non-overlapping clocks can be generated so that only PD is off when then PU is on and the PU is off when the PD is on. Likewise the potential on the backside of the DUT can be generate so that it is Vdd when PU is on and GND when PD is on. For a PMOS only pseudo-inverter it is important to make the PD gate voltage lower than at least one threshold voltage (Vth) of the PD PMOS. Additional margin while still keeping the gate voltage below oxide breakdown makes the design more robust.

The invention has been described in terms of particular embodiments. Other embodiments are within the scope of the following claims. For example, the steps of the invention can be performed in a different order and still achieve desirable results. While certain representative embodiments and details have been shown for purposes of illustrating the invention, it will be apparent to those skilled in the art that various changes in the methods and apparatus disclosed herein may be made without departing from the scope of the invention which is defined in the appended claims.

The invention claimed is:

1. A method for estimating at least one dimension of a structure of an integrated circuit device under test (DUT) using a charged-based capacitance measurement (CBCM) technique, the method comprising:
   providing a metrology structure having a pseudo-inverter comprising a pull-up, pull-down transistor switch, and an output, wherein the transistor switch comprises a pull-up transistor and a pull-down transistor of same transistor type;
   charging and discharging the DUT coupled to the output of the pseudo-inverter using non-overlapping clock signals comprising a first clock signal electrically connected with a gate of the pull-up transistor and a second clock signal electrically connected with a gate of the pull-down transistor, the second clock signal non-overlapping with respect to the first clock signal, wherein the non-overlapping clock signals are configured for: turning the pull-down transistor off when the pull-up transistor is on; and
   turning the pull-down transistor on when the pull-up transistor is off;
   providing a first backside voltage bias for the DUT when the pull-up transistor is on and the pull-down transistor is off such that voltage potential of a backside of the DUT comprises a positive supply voltage Vdd;
   providing a second backside voltage bias for the DUT when the pull-up transistor is off and the pull-down transistor is on such that the potential of the backside of the DUT comprises ground (GND); measuring capacitance of the DUT with a gate voltage of the pull-up transistor at a preset value to obtain a value of the measured capacitance; and
   using the value of the measured capacitance to estimate the at least one dimension of the structure in the DUT.

2. The method of claim 1, wherein both the pull-up transistor and the pull-down transistor are n-channel metal-oxide-semiconductor (NMOS) transistors.

3. The method of claim 2, wherein the preset value of the gate voltage of the pull-up NMOS transistor comprises a voltage greater than Vdd plus at least a worst-case threshold voltage of the pull-down NMOS transistor.

4. The method of claim 3, wherein a maximum preset value of the gate voltage is kept lower than a voltage where an oxide layer in the integrated circuit device breaks down.

5. The method of claim 1, wherein both the pull-up transistor and the pull-down transistor are p-channel metal-oxide-semiconductor (PMOS) transistors.

6. The method of claim 5, wherein the preset value of the gate voltage of the pull-up PMOS transistor comprises a voltage lower than at least a threshold voltage of the pull-down PMOS transistor.

7. The method of claim 6, wherein a maximum preset value of the gate voltage is kept lower than a voltage where an oxide layer in the integrated circuit device breaks down.

8. The method of claim 1, wherein the CBCM technique comprises a charge-injection-error-free (CIEF) CBCM technique.

9. A method for estimating at least one dimension of a structure in an integrated circuit device under test (DUT) using a charged-based capacitance measurement (CBCM) technique for instances wherein complementary metal-oxide-silicon (CMOS) devices are not available, the method comprising:
   at a metrology structure provided with a pseudo-inverter switch comprising a pull-up transistor and a pull-down transistor of same transistor type, and an output, wherein the pseudo-inverter switch comprises a structure wherein a positive supply voltage (Vdd) of the DUT is electrically connected with a source of the pull-up transistor, a drain of pull-up transistor is electrically connected with a source of the pull-down transistor of the same transistor type and with an the output of the pseudo-inverter switch which is configured for charging and discharging the DUT, wherein a drain of the pull-down transistor is electrically connected with electrical ground (GND), and wherein the gate of the pull-up transistor is electrically connected to receive a first clock signal and the gate of the pull-down transistor is electrically connected to receive a second clock signal that is opposite in polarity and non-overlapping with respect to the first clock signal:
   charging and discharging the DUT coupled to the output of the pseudo-inverter switch using the non-overlapping clock signals, wherein the non-overlapping clock signals are configured for (i) turning the pull-down transistor off when the pull-up transistor is on and (ii) turning the pull-down transistor on when the pull-up transistor is off;
   providing a first backside voltage bias for the DUT when the pull-up transistor is on and the pull-down transistor is off such that voltage potential of a backside of the DUT comprises a positive supply voltage Vdd;
   providing a second backside voltage bias for the DUT when the pull-up transistor is off and the pull-down transistor is on such that the potential of the backside of the DUT comprises ground (GND); measuring capacitance of the DUT with a gate voltage of the pull-up transistor at a preset value to obtain a value of the measured capacitance; and
   using the value of the measured capacitance to estimate the at least one dimension of the structure in the integrated circuit DUT.

10. The method of claim 9 wherein both the pull-up transistor and the pull-down transistor are n-channel metal-oxide-semiconductor (NMOS) transistors.

11. The method of claim 9 wherein both the pull-up transistor and the pull-down transistor are p-channel metal-oxide-semiconductor (PMOS) transistors.

12. The method of claim 11 wherein the preset value of the gate voltage of the pull-up PMOS transistor comprises a voltage lower than at least a threshold voltage of the pull-down PMOS transistor.

13. The method of claim 12 wherein a maximum preset value of the gate voltage is kept lower than a voltage where an oxide layer in the integrated circuit device breaks down.

14. The method of claim 9 wherein the preset value of the gate voltage of the pull-up NMOS transistor comprises a voltage greater than Vdd plus at least a worst-case threshold voltage of the pull-down NMOS transistor.

15. The method of claim 14 wherein a maximum preset value of the gate voltage is kept lower than a voltage where an oxide layer in the integrated circuit device breaks down.

16. The method of claim 9 wherein the CBCM technique comprises a charge-injection-error-free (CIEF) CBCM technique.

* * * * *